(12) United States Patent
Cho et al.

(10) Patent No.: US 7,732,802 B2
(45) Date of Patent: Jun. 8, 2010

(54) SEMICONDUCTOR LIGHT EMITTING DEVICE

(75) Inventors: Bum Chul Cho, Jeonju-si (KR); Seung Hyun Yang, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 74 days.

(21) Appl. No.: 12/103,553

(22) Filed: Apr. 15, 2008

(65) Prior Publication Data

US 2008/0251803 A1   Oct. 16, 2008

(30) Foreign Application Priority Data

Apr. 16, 2007   (KR) .................... 10-2007-0036856

(51) Int. Cl.
*H01L 31/00* (2006.01)

(52) U.S. Cl. .............................. 257/13; 257/85; 257/95; 257/E25.019

(58) Field of Classification Search .................... 257/13, 257/76, 78, 85, 90, 94–97, E25.019
See application file for complete search history.

(56) References Cited

U.S. PATENT DOCUMENTS

| 4,638,334 A * | 1/1987 | Burnham et al. ............. 347/239 |
| 2007/0036189 A1* | 2/2007 | Hori et al. ................. 372/50.11 |

* cited by examiner

*Primary Examiner*—Evan Pert
*Assistant Examiner*—Scott R Wilson
(74) *Attorney, Agent, or Firm*—Birch, Stewart, Kolasch & Birch, LLP

(57) ABSTRACT

Disclosed is a semiconductor light emitting device. The semiconductor light emitting device comprises a substrate comprising a reflective pattern with a valley, a first nitride semiconductor layer on the substrate, an air gap formed between the reflective pattern and the first nitride semiconductor layer, an active layer on the first nitride semiconductor layer, and a second nitride semiconductor layer on the active layer.

20 Claims, 6 Drawing Sheets

SEMICONDUCTOR LIGHT EMITTING DEVICE

The present application claims priority under 35 U.S.C. 119 and 35 U.S.C. 365 to Korean Patent Application No. 10-2007-0036856 (filed on Apr. 16, 2007), which is hereby incorporated by reference in its entirety.

BACKGROUND

Light emitting diodes (LEDs) can emit light having various colors by using GaAs, AlGaAs, GaN, InGaN, and InGaAlP-based compound semiconductor materials. Such LEDs are packaged to be used as a light source in various fields such as a lightening indicator, a character indicator, and an image indicator.

Such a LED has a structure in which an N-type semiconductor layer, an active layer, and a P-type semiconductor layer are stacked on each other, and light is generated from the active layer and emitted to an exterior if power is applied to the LED.

SUMMARY

The embodiment provides a semiconductor light emitting device comprising an air gap on a substrate or on a pattern of the substrate.

The embodiment provides a semiconductor light emitting device comprising an air gap on a reflective pattern of a substrate.

The embodiment provides a semiconductor light emitting device, in which an air gap is formed between a substrate and a semiconductor layer, thereby improving external quantum efficiency.

The embodiment provides a semiconductor light emitting device comprising; a substrate comprising a reflective pattern with a valley, a first nitride semiconductor layer on the substrate, an air gap formed between the reflective pattern and the first nitride semiconductor layer, an active layer on the first nitride semiconductor layer, and a second nitride semiconductor layer on the active layer.

The embodiment provides a semiconductor light emitting device comprising; a substrate comprising a valley, a first nitride semiconductor layer on the substrate, an air gap formed in the valley between the substrate and the first nitride semiconductor layer, an active layer on the first nitride semiconductor layer, and a second nitride semiconductor layer on the active layer.

DETAILED DESCRIPTION OF THE EMBODIMENTS

Hereinafter, a semiconductor light emitting device according to the embodiments will be described with respect to accompanying drawings.

Figure 1:
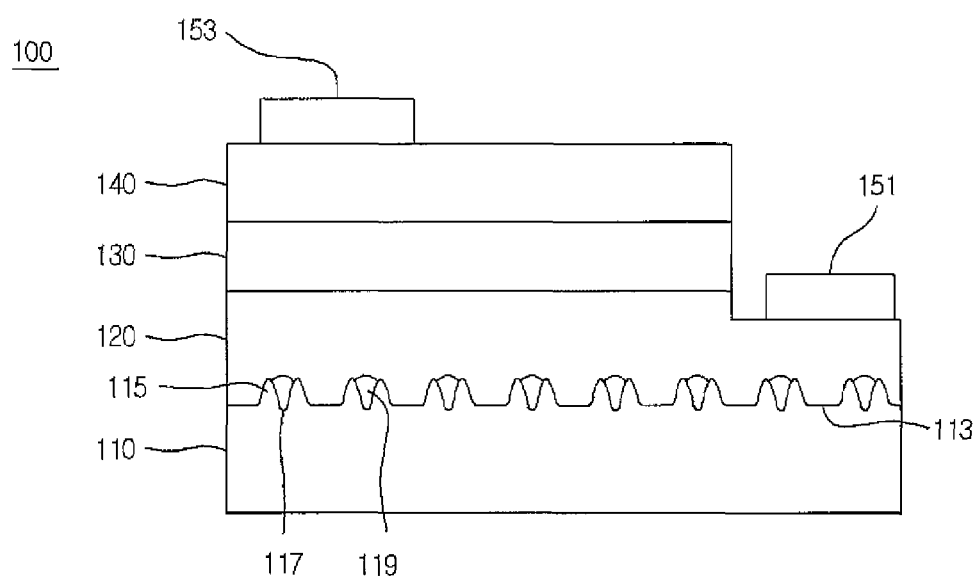
FIG. 1 is a side sectional view showing a semiconductor light emitting device according to a first embodiment.

FIG. 1 is a side sectional view showing a semiconductor light emitting device 100 according to the first embodiment.

Referring to FIG. 1, the semiconductor light emitting device 100 comprises a substrate 110 comprising a reflective pattern 115, a first nitride semiconductor layer 120, an active layer 130, a second nitride semiconductor layer 140, a first electrode 151, and a second electrode 153.

The substrate 110 comprises one of $Al_2O_3$, SiC, ZnO, Si, GaAs, GaN, and a substrate with metal ingredient. The substrate 110 may comprise conductivity. Such a substrate 110 may be formed on a surface 113 thereof with a plurality of reflective patterns 115. The reflective pattern 115 comprises a ring-shape profile, and is formed therein with a valley 117 comprising a predetermined depth. The ring-shape profile may correspond to one of a cylindrical shape, a ring shape, a doughnut shape, and a polygonal prism shape.

The reflective patterns 115 may be formed on the substrate 110 at a constant interval or a random interval, but the embodiment is not limited thereto.

The first nitride semiconductor layer 120 is formed on the substrate 110. An air gap 119 is formed between the substrate 110 and the first nitride semiconductor layer 120.

The air gap 119 is formed in a portion of or an entire area of the valley 117 provided in the reflective pattern 115, and filled with air. Such an air gap may comprise a reverse pyramid shape such as a reverse conical shape or a reverse polygonal pyramid shape.

The refractive index of the air gap 119 is 1, and comprises a value different from the refractive index of the substrate 110, the reflective pattern 115, and the first nitride semiconductor layer 120. Accordingly, light generated from the active layer 130 is refracted or reflected from the reflective pattern 115 and the air gap 119 positioned at the border of the substrate 110 and the first nitride semiconductor layer 120, so that the light may be emitted to an exterior.

The first nitride semiconductor layer 120 comprises at least one of a buffer layer, an undoped semiconductor layer, and an N-type semiconductor layer. For example, the N-type semiconductor layer may be formed on the substrate 110, or the buffer layer and the N-type semiconductor layer may be sequentially stacked on the substrate 110. In addition, the buffer layer, the undoped semiconductor layer, and the N-type semiconductor layer may be sequentially stacked on the substrate 110. The buffer layer comprises GaN, InN, AlN, AlInN, InGaN, AlGaN, or InAlGaN. The undoped semiconductor layer comprises GaN. The N-type semiconductor layer comprises GaN, InN, AlN, InGaN, AlGaN, or InAlGaN. The N-type semiconductor layer may be doped with an N-type dopant such as Si, Ge, Sn, Se, or Te.

The active layer 130 is formed on the first nitride semiconductor layer 120, and may comprise a single quantum well or a multiple quantum well.

The second nitride semiconductor layer 140 is formed on the active layer 130. The second nitride semiconductor layer 140 may be a P-type semiconductor layer comprising one selected from the group consisting of GaN, AlGaN, InGaN, and InAlGaN, and is doped with a P-type dopant such as Mg, Be, or Zn.

In this case, another semiconductor layer may be additionally formed over and/or under each of the semiconductor layers 120, 130, and 140, and such a stacked structure of the semiconductor layers may be modified. In addition, the second nitride semiconductor layer 140 may comprise a semiconductor layer comprising a P-type semiconductor layer and an N-type semiconductor layer stacked on the P-type semiconductor layer.

The first electrode 151 may be formed on the first nitride semiconductor layer, and the second electrode 153 may be formed on the second nitride semiconductor layer 140. The second electrode 153 selectively comprises ITO, ZnO, RuOx, TiOx, or IrOx, or may comprise a one layer or multiple layers comprising a material such as Ti, Au, Pd, or Ni. However, the embodiment is not limited thereto.

The first nitride semiconductor layer 120 may comprise a P-type semiconductor layer, and the second nitride semiconductor layer 140 may comprise an N-type semiconductor layer. In addition, the first electrode may be formed under the substrate 110, and the substrate 110 may be the conductive support substrate.

FIGS. 2 to 10 are views showing the manufacturing process of the semiconductor light emitting device according to the first embodiment.

Figure 2:
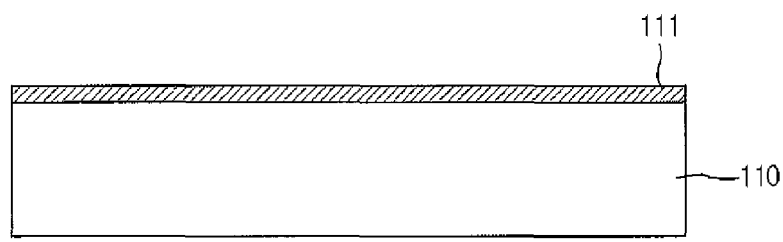
FIGS. 2 to 10 are views showing a method for manufacturing a semiconductor light emitting device according to the first embodiment.
Figure 3:
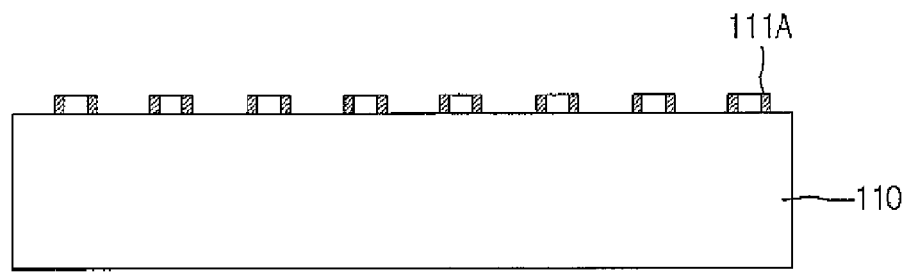

Referring to FIGS. 2 and 3, after coating a photoresist layer 111 on the substrate 110, a light is exposed on the photoresist layer 111, thereby forming mask patterns 111A. According to the embodiment, such a mask pattern forming process or the interval of the mask patterns 111A may vary. The substrate 110 comprises one of $Al_2O_3$, SiC, ZnO, Si, GaAs, GaN, and a substrate with metal ingredient. The substrate 110 may employ a conductive substrate.

Figure 4:
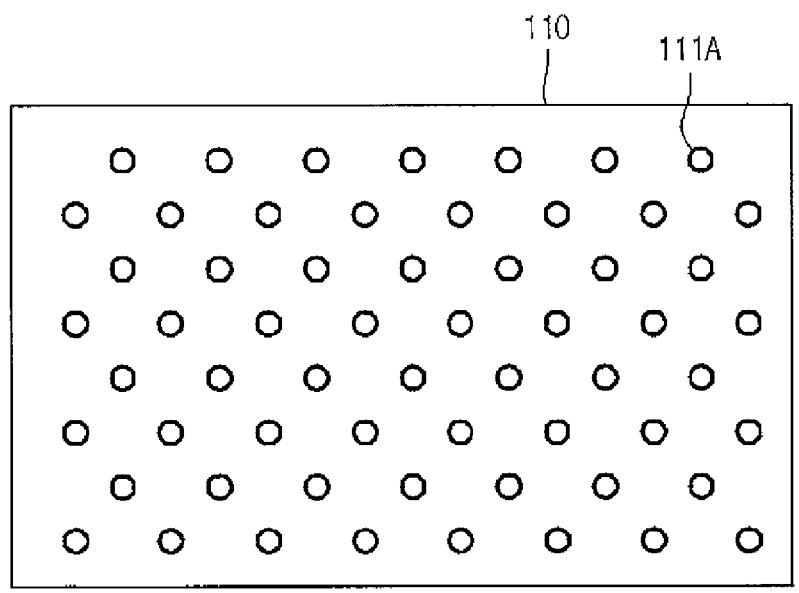

FIG. 4 is a plan view showing the mask pattern 111A formed on the substrate 110 according to the first embodiment.

Referring to FIG. 4, the mask pattern 111A comprises a ring-shape profile. The ring-shape profile corresponds to one of a cylindrical shape, a ring shape, and a doughnut shape. The mask pattern 111A may comprise an oval prism shape or a polygonal prism shape. In addition, the mask pattern 111A may comprise a structure in which a plurality of ring shapes, oval shapes, and polygonal shapes are coupled to each other.

Figure 5:
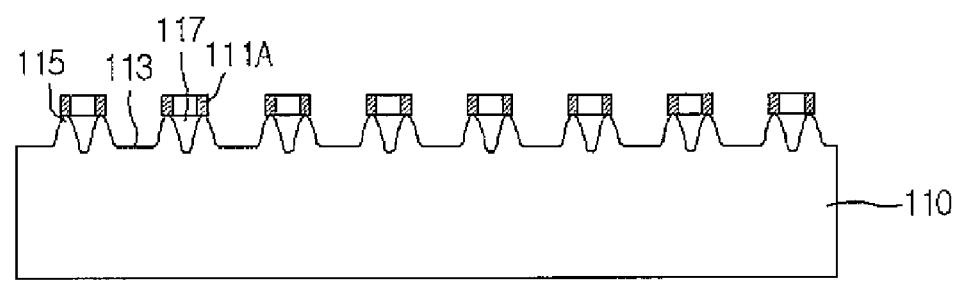

Referring to FIG. 5, an etching process may be formed over the substrate 110. The etching process is performed except for the mask pattern 111A. At this time, the reflective pattern 115 is formed on the surface 113 of the substrate 110. The above etching scheme comprises a dry etching scheme such as a reactive ion etching (RIE) scheme or an inductive coupled plasma scheme.

The reflective pattern 115 comprising a ring shape is formed on the surface 113 of the substrate 110. If such a reflective pattern 115 is formed, the mask pattern 111A is removed or cleaned.

The valley 117 is formed in the reflective pattern 115 by a predetermined depth. The depth of the valley 117 corresponds to a surface depth of the substrate 110, and the embodiment is not limited thereto.

Figure 6:
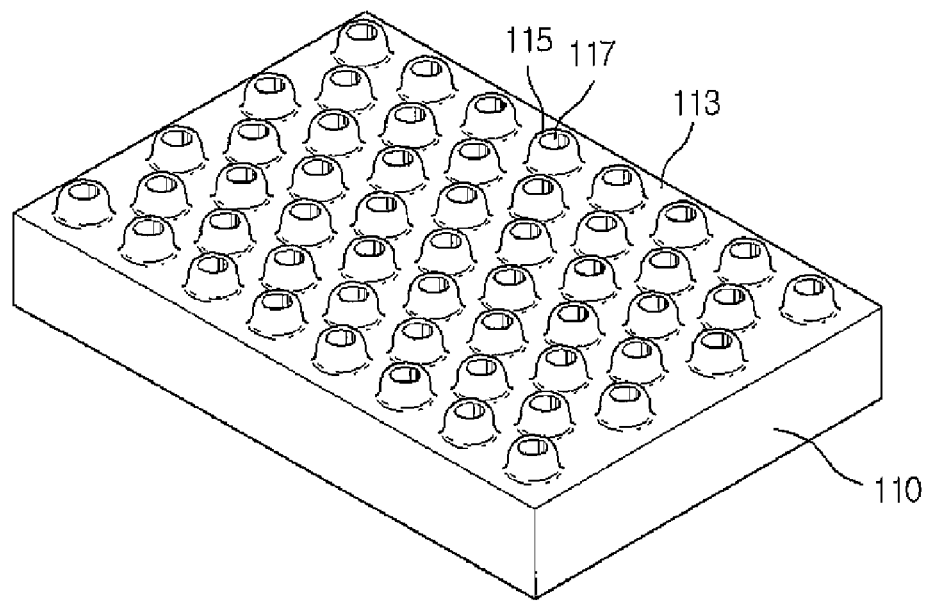

FIG. 6 is a perspective view showing the substrate comprising the reflective pattern according to the first embodiment.

Referring to FIG. 6, a plurality of reflective patterns 115 are formed on the surface 113 of the substrate 110, and the adjacent reflective patterns 115 are arranged in a zigzag way. The valley 117 comprising a reverse conical shape is formed in the reflective pattern 115 by a predetermined depth.

FIGS. 7(A) and 7(B) are a plan view and a side sectional view showing the reflective pattern 115 according to the first embodiment.

Figure 7:
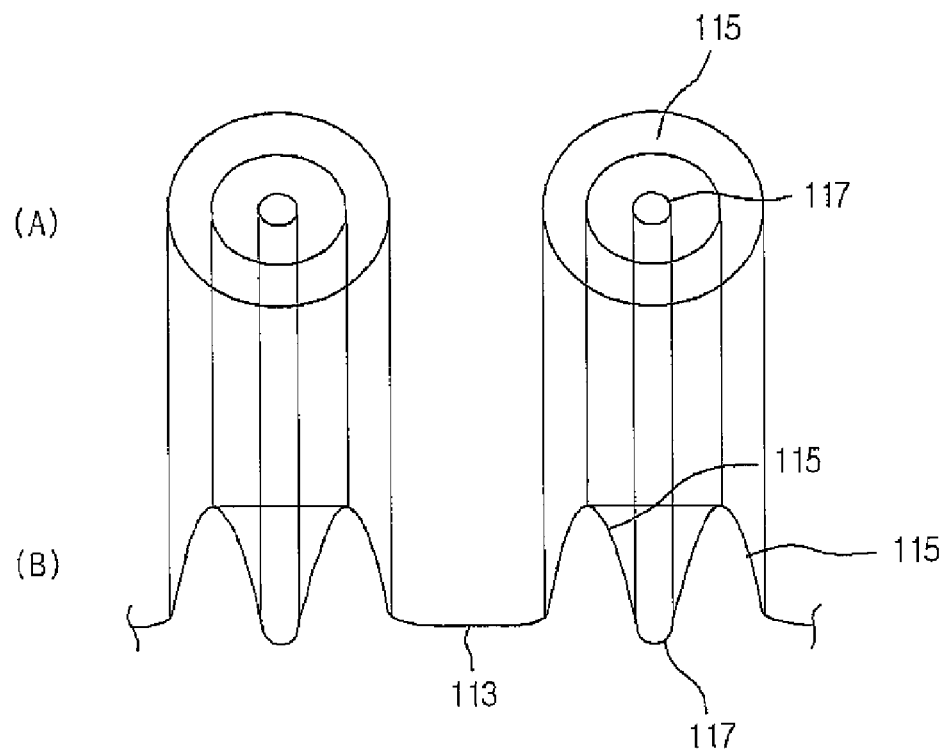

Referring to FIG. 7, the ring-shape profile of the reflective pattern 115 is formed corresponding to a triangle shape or a pyramid shape, and the valley 117 comprising a reverse conical shape or a reverse polygonal pyramid shape is formed in the reflective pattern 115.

Figure 8:
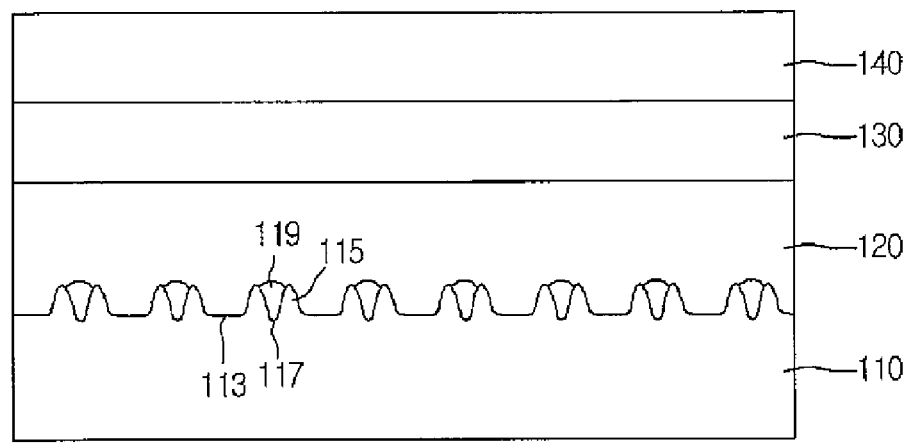
Figure 9:
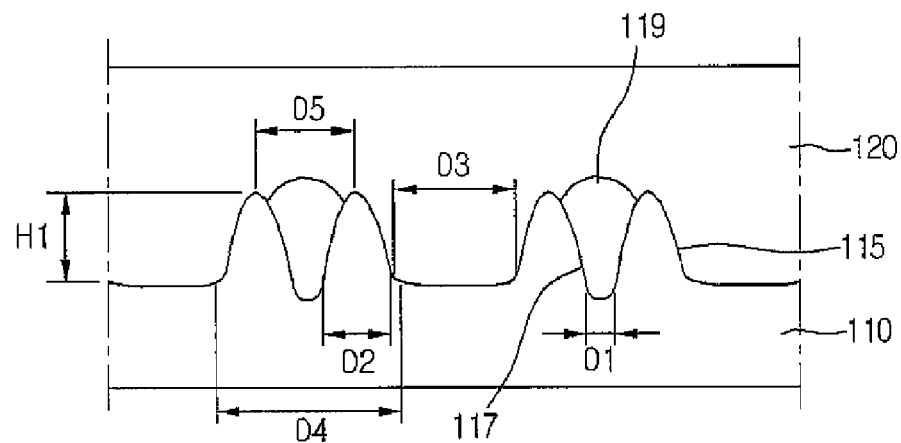

FIG. 8 is a side sectional view showing the substrate formed with a light emitting structure according to the first embodiment, and FIG. 9 is an enlarged view partially showing the reflective pattern 115 of FIG. 8.

Referring to FIGS. 8 and 9, the first nitride semiconductor layer 120 is formed on the substrate 110. The first nitride semiconductor layer 120 comprises at least one of the buffer layer, the undoped semiconductor layer, and the N-type semiconductor layer. If the first nitride semiconductor layer 120 is an N-type GaN layer, the N-type GaN layer is formed by supplying an atmospheric gas (selected from $H_2$, $N_2$, and $NH_3$), a source gas (TMGa or TEGa), and Si.

The air gap 119 is formed between the reflective pattern 115 comprising a ring-shape profile and the first nitride semiconductor layer 120. The air gap 119 corresponds to a predetermined area of the inner valley 117 of the reflective pattern 115. The air gap 119 comprises air instead of the first nitride semiconductor layer 120. In this case, when the valley 117 of the reflective pattern 115 comprises a diameter smaller than or equal to a predetermined diameter (e.g., 0.5 μm to 1 μm), the air gap 119 may be formed. Therefore, the shape of the reflective pattern 115 can be changed within the range that the valley 117 of the reflective pattern 115 satisfies the above diameter.

The air gap 119 comprises a refractive index of 1 which is an air refractive index. In detail, the refractive index of the air gap 119 is different from those of the substrate 110, the reflective pattern 115, and the first nitride semiconductor layer 120.

Referring to FIG. 9, the ring thickness D2 of the reflective pattern 115 is in the range of about 1.5 um to about 2 um. The least diameter D1 of the valley 117 may be 0.5 um or less, and the interval D5 between rings may be in the range of about 1.5 um to about 2 um. In addition, the diameter D4 of the reflective pattern 115 is in the range of about 3.5 um to about 5 um. The height H1 of the ring or depth of the valley 117 of the reflective pattern 115 may be the range of about 1.5 um to about 2 um, and the distance D3 between adjacent reflective patterns may be in the range of about 2 um or about 3 um. The embodiment is not limited to the size of the reflective pattern and the air gap, and the size of the reflective pattern and the air gap may be changed.

Figure 10:
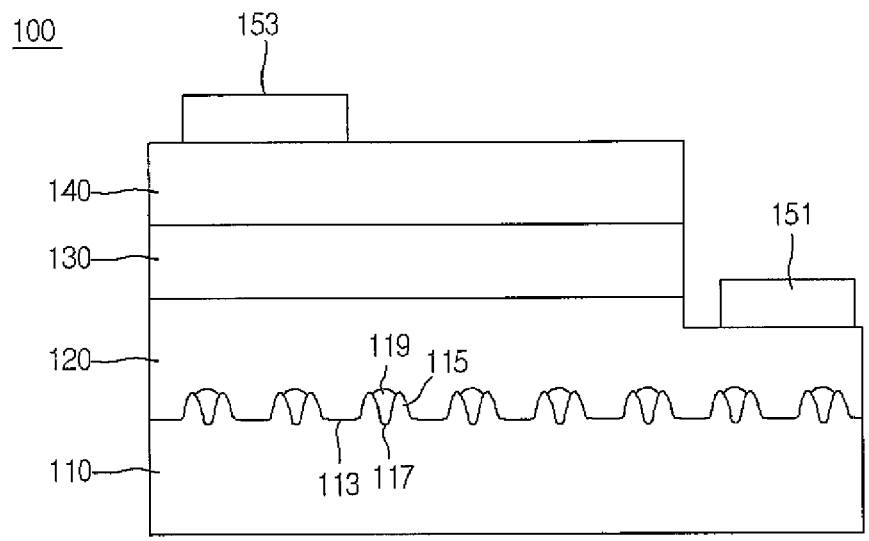

Referring to FIG. 10, a portion of the first nitride semiconductor layer 120 is exposed by etching a portion of the second nitride semiconductor layer 140. The first electrode 151 is formed on the exposed portion of the first nitride semiconductor layer 120, and the second electrode 153 is formed on the second nitride semiconductor layer 140.

The embodiment can employ one of a P-N junction structure, an N-P junction structure, a P-N-P junction structure, and an N-P-N junction structure based on compound semiconductor materials comprising GaAs, AlGaAs, GaN, InGaN, and AlGaInP.

If current is applied through the first and second electrodes 151 and 153, the semiconductor light emitting device 100 generates a light from the active layer 130 and emits the light in all directions. At this time, a light toward the substrate 110 is scattered by the reflective pattern 115 positioned at the border of the substrate 110 and the first nitride semiconductor layer 120. In addition, the light toward the substrate 110 is refracted by the air gap 119 of the reflective pattern 115 or reflected by the substrate surface 113. Therefore, a light progressing to the substrate 110 is reflected or the incident angle of the light is changed by the reflective pattern 115 and the air gap 119, so that the light may be sufficiently delivered to the outside of the semiconductor light emitting device. Accordingly, it is possible to improve external quantum efficiency.

Figure 11:
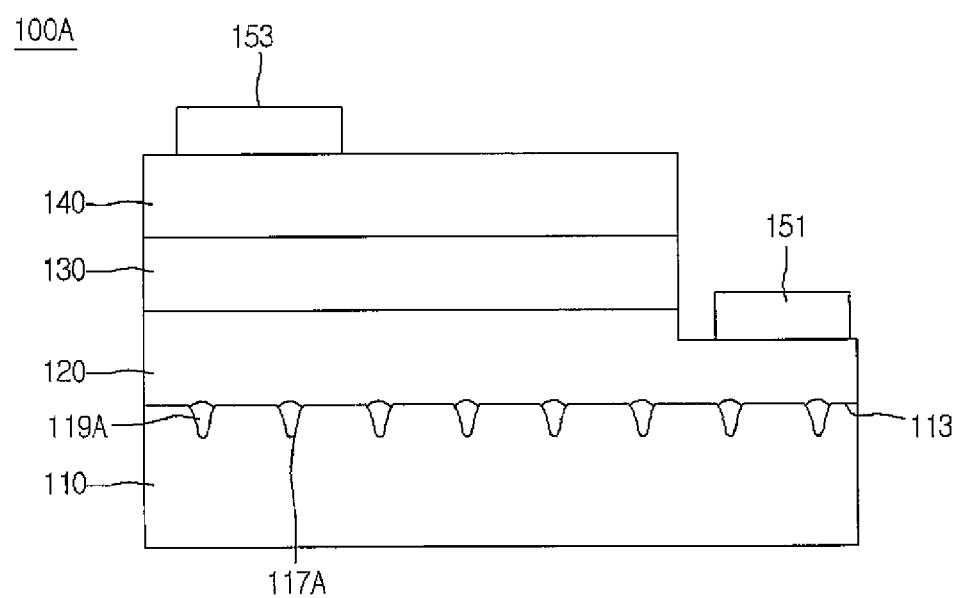
FIG. 11 is a side sectional view showing a semiconductor light emitting device according to a second embodiment.

FIG. 11 is a side sectional view showing a semiconductor light emitting device according to a second embodiment. The same reference numerals will be assigned to elements identical to those of the first embodiment, and details of thereof will be omitted.

Referring to FIG. 11, a semiconductor light emitting device 110A comprises an air gap 119A formed on a surface 113 of a substrate 110. The air gap 119A may comprise a reverse conical shape or a reverse polygonal pyramid shape, and a predetermined length within a predetermined diameter (e.g., 2 um).

The air gap 119A exists as air in a valley 117A or a portion of the valley 117A formed on the surface 113 of the substrate 110, and refracts or reflects an incident light.

The first nitride semiconductor layer 120 is formed on the substrate 110, comprises at least one of a buffer layer, an undoped semiconductor layer, and an N-type semiconductor layer. Here, the first nitride semiconductor layer 120 may comprises P-type semiconductor.

The embodiment can employ a vertical semiconductor light emitting device. In the vertical semiconductor light emitting device, a first nitride semiconductor layer, an active layer, a second nitride semiconductor, a adhesive layer, a conductive support substrate are formed on a substrate (not shown). The conductive support substrate is formed on the second nitride semiconductor, and the second electrode is formed on the conductive support substrate. In here, the conductive support substrate may be coupled to the second nitride semiconductor layer 120 by the adhesive layer. Also The substrate (not shown) is removed by a physical or chemical removal method, for instance a laser lift off (LLO) method. Next, the conductive support substrate is positioned on a base, and a first electrode is formed on the first nitride semiconductor. In this case, the reflective pattern 115 comprising the valley may be formed at the conductive support substrate Also, the conductive support substrate is formed under the first nitride semiconductor, and the first electrode is formed under the conductive support substrate.

When it is described according to the embodiment that a layer (films), a region, a pattern, or structures are formed "on" or "under" another layer, another region, another pad, other patterns, it means that they are "directly" or "indirectly" formed "on" or "under" another layer, another region, another pad, other patterns. The substrate and the thickness of each semiconductor layer have been described for illustrative purposes, and the embodiment is not limited to a thickness ratio shown in drawings.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
    a substrate comprising a plurality of discrete and separated protruding reflective patterns protruding from the substrate and including a valley;
    a first nitride semiconductor layer on the substrate and covering the reflective patterns;
    an air gap formed in the valley of a corresponding reflective pattern between the substrate and the first nitride semiconductor layer;
    an active layer on the first nitride semiconductor layer; and
    a second nitride semiconductor layer on the active layer.

2. The semiconductor light emitting device as claimed in claim 1, wherein the corresponding reflective pattern comprises a cylindrical ring shape or polygonal prism shape.

3. The semiconductor light emitting device as claimed in claim 1, wherein the valley including the air gap comprises a reverse conical shape on the reflective pattern.

4. The semiconductor light emitting device as claimed in claim 1, wherein the substrate comprises one of $Al_2O_3$, SiC, ZnO, Si, GaAs GaN, and a substrate with metal ingredient.

5. The semiconductor light emitting device as claimed in claim 1, wherein a refractive index of the air gap is 1.

6. The semiconductor light emitting device as claimed in claim 1, wherein the first nitride semiconductor layer comprises at least one of a buffer layer, an undoped semiconductor layer, and an N-type semiconductor layer.

7. The semiconductor light emitting device as claimed in claim 1, further comprising:
    an adhesive layer formed between the substrate and the first nitride semiconductor layer,
    wherein the substrate comprises a conductive support substrate, and
    wherein the first nitride semiconductor layer comprises a P-type semiconductor layer, and the second nitride semiconductor comprises an N-type semiconductor layer.

8. The semiconductor light emitting device as claimed in claim 1, wherein the corresponding reflective pattern comprises a diameter equal to or smaller than 6 um.

9. The semiconductor light emitting device as claimed in claim 1, wherein adjacent reflective patterns are formed at an interval equal to or smaller than 6 um.

10. A semiconductor light emitting device comprising:
    a substrate comprising a reflective pattern with a valley;
    a first nitride semiconductor layer on the substrate;
    an air gap formed between the reflective pattern and the first nitride semiconductor layer;
    an active layer on the first nitride semiconductor layer; and
    a second nitride semiconductor layer on the active layer,
    wherein the air gap comprises a diameter equal to or smaller than 2 um and a depth equal to or more than in a range of 1.5 um to 2 um.

11. A semiconductor light emitting device comprising:
    a substrate including a plurality of valleys directly formed in a surface of the substrate;
    a first nitride semiconductor layer on the substrate;
    an air gap formed in valleys between the substrate and the first nitride semiconductor layer;
    an active layer on the first nitride semiconductor layer; and
    a second nitride semiconductor layer on the active layer.

12. The semiconductor light emitting device as claimed in claim 11, wherein a corresponding valley comprises a predetermined diameter and a predetermined depth in the substrate.

13. The semiconductor light emitting device as claimed in claim 12, wherein the substrate comprises a plurality of reflective patterns with the valleys.

14. The semiconductor light emitting device as claimed in claim 13, wherein a corresponding reflective pattern comprises a cylindrical ring shape or a polygonal prism shape, and the air gap is formed in the valleys of the reflective patterns.

15. The semiconductor light emitting device as claimed in claim 14, wherein the corresponding reflective pattern with a ring shape comprises a diameter equal to or smaller than 6 um.

16. The semiconductor light emitting device as claimed in claim 11, wherein the corresponding valley including the air gap comprises a reverse conical shape.

17. The semiconductor light emitting device as claimed in claim 11, wherein the first nitride semiconductor layer and the second nitride semiconductor comprise a semiconductor layer of different polarity.

18. The semiconductor light emitting device as claimed in claim 11, wherein the first nitride semiconductor layer comprises at least one of a buffer layer, an undoped semiconductor layer, and an N-type semiconductor layer.

19. The semiconductor light emitting device as claimed in claim 11, wherein a plurality of air gaps are formed at a constant interval or a random interval.

20. A semiconductor light emitting device comprising:
a substrate comprising a valley;
a first nitride semiconductor layer on the substrate;
an air gap formed in the valley between the substrate and the first nitride semiconductor layer;
an active layer on the first nitride semiconductor layer; and
a second nitride semiconductor layer on the active layer,
wherein the air gap comprises a diameter equal to or smaller than 2 um and a depth in a range of 1.5 um to 2 um.

* * * * *